(12) United States Patent  
Morisse et al.

(10) Patent No.: US 11,825,056 B2  
(45) Date of Patent: Nov. 21, 2023

(54) SYSTEM AND METHOD FOR OBTAINING A UNIFORM INK LAYER

(71) Applicant: ESKO Software BV, Ghent (BE)

(72) Inventors: Peter Morisse, Bornem (BE); Wolfgang Sievers, Kremperheide (DE); Thomas Klein, Wolfenbuettel (DE)

(73) Assignee: ESKO Software BV, Ghent (BE)

( * ) Notice: Subject to any disclaimer, the term of this patent is extended or adjusted under 35 U.S.C. 154(b) by 0 days.

(21) Appl. No.: 17/861,724

(22) Filed: Jul. 11, 2022

(65) Prior Publication Data

US 2022/0345587 A1 Oct. 27, 2022

Related U.S. Application Data

(63) Continuation of application No. 16/950,361, filed on Nov. 17, 2020, now Pat. No. 11,388,311.

(60) Provisional application No. 63/035,303, filed on Jun. 5, 2020.

(51) Int. Cl.
*H04N 1/405* (2006.01)
*B41J 2/21* (2006.01)
*H04N 1/52* (2006.01)

(52) U.S. Cl.
CPC ............ *H04N 1/405* (2013.01); *B41J 2/2114* (2013.01); *B41J 2/2132* (2013.01); *H04N 1/52* (2013.01)

(58) Field of Classification Search
CPC .......... H04N 1/405; H04N 1/52; B41J 2/2114
See application file for complete search history.

(56) References Cited

U.S. PATENT DOCUMENTS

| | | |
|---|---|---|
| 6,213,018 B1 | 4/2001 | Samworth |
| 6,492,095 B2 | 12/2002 | Samworth |
| 6,532,082 B1 | 3/2003 | Dewitte |
| 6,731,405 B2 | 5/2004 | Samworth |
| 7,580,154 B2 | 8/2009 | Samworth |

(Continued)

FOREIGN PATENT DOCUMENTS

| | | |
|---|---|---|
| EP | 1557279 A2 | 7/2005 |
| EP | 3318413 A1 | 5/2018 |
| WO | 2019226737 A1 | 11/2019 |

OTHER PUBLICATIONS

International Preliminary Report on Patentability and Written Opinion for International Application No. PCT/EP2020/083855, dated Dec. 6, 2022, 8 pages.

(Continued)

*Primary Examiner* — Quang N Vo
(74) *Attorney, Agent, or Firm* — RatnerPrestia

(57) ABSTRACT

A printing plate having a printing surface for receiving ink, including a defined area of an image intended to print with ink and a surface pattern applied to the defined area. The surface pattern includes a plurality of rows each having a plurality of diagonally oriented line segments, each line segment corresponding to an ink-carrying relief structure in a raised area of the plate, the plurality of diagonally oriented line segments having orientations alternating between a positive angle in one row and a negative angle in an adjacent row, wherein each line segment has a first end aligned with a middle portion of and spaced apart from a first line of a first adjacent row and a second end aligned with a middle portion of and spaced apart from a second line of a second adjacent row.

16 Claims, 11 Drawing Sheets

(56) References Cited

U.S. PATENT DOCUMENTS

| | | | |
|---|---|---|---|
| 8,540,332 B2* | 9/2013 | Shibata | B41J 29/393 |
| | | | 347/15 |
| 8,654,400 B2 | 2/2014 | Cave | |
| 9,069,252 B2 | 6/2015 | Schieffer, Jr. et al. | |
| 9,235,125 B2 | 1/2016 | Peeters et al. | |
| 2014/0057207 A1 | 2/2014 | Baldwin | |
| 2016/0355004 A1 | 12/2016 | Blomquist et al. | |
| 2018/0141325 A1 | 5/2018 | Kuramoto et al. | |
| 2018/0210345 A1 | 7/2018 | Wolterink et al. | |
| 2019/0111721 A1* | 4/2019 | Lowes | B41N 1/12 |
| 2019/0315141 A1 | 10/2019 | Morisse et al. | |

OTHER PUBLICATIONS

International Search Report and Written Opinion for International Application No. PCT/EP2020/083855, dated Feb. 5, 2021, 13 pages.

Entire patent prosecution history of U.S. Appl. No. 16/950,361, filed Nov. 17, 2020, entitled, "System and Method for Obtaining a Uniform Ink Layer."

* cited by examiner

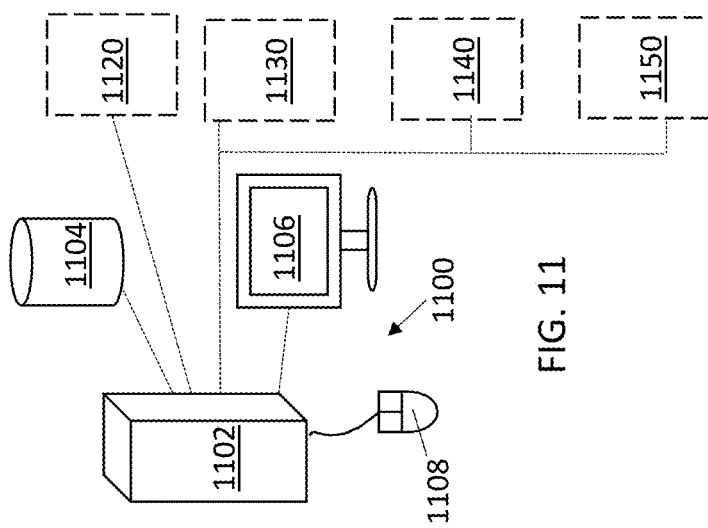
FIG. 11
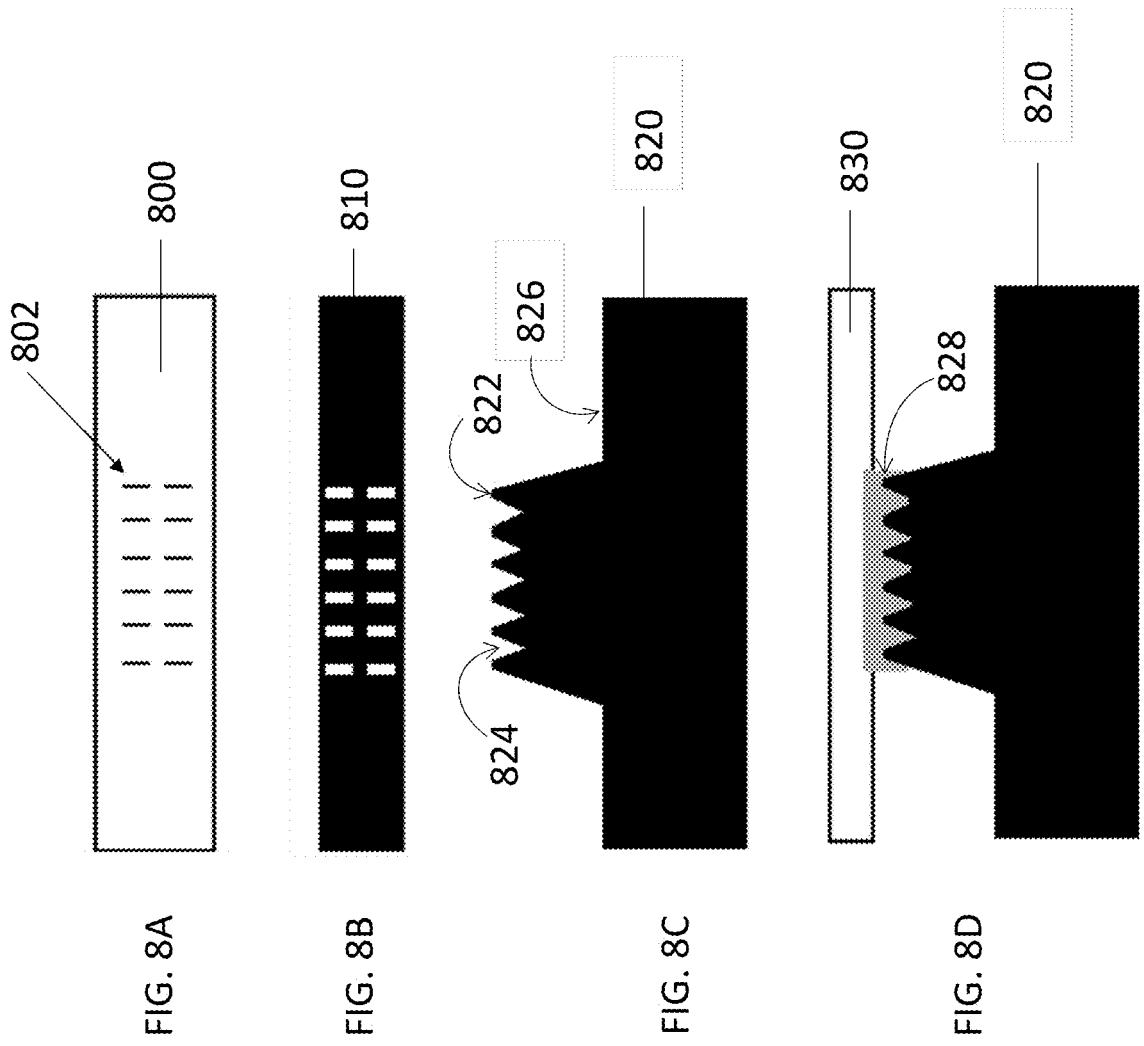
FIG. 8A
FIG. 8B
FIG. 8C
FIG. 8D

SYSTEM AND METHOD FOR OBTAINING A UNIFORM INK LAYER

CROSS-REFERENCE TO RELATED APPLICATIONS

This application is a continuation application of U.S. application Ser. No. 16/950,361, filed Nov. 17, 2020, which claims priority to U.S. Provisional Application No. 63/035,303, filed Jun. 5, 2020, both of which are titled "SYSTEM AND METHOD FOR OBTAINING A UNIFORM INK LAYER," and are incorporated herein by reference in their entireties.

BACKGROUND OF THE INVENTION

In flexography, inking a substrate with a background ink (e.g. white) is commonly required, such as on substrates that are transparent or have a non-neutral color. Important criteria for the background ink layer is its hiding quality and its color uniformity. Relatively better hiding quality results in a relatively lesser amount of light coming through the background ink layer. Relatively better uniformity allows relatively more accurate color reproduction of artwork that is printed on top of the background. Maximizing hiding quality and uniformity may be impeded by specific characteristics of the ink (e.g. a low pigmented ink) and/or the substrate (e.g. an ink-repellent substrate) that result in incomplete or uneven ink transfer Basic methods to increase the hiding capacity of the background ink layer include using large quantities of background ink (e.g. by using a large volume anilox to ink the plate) and/or printing multiple layers of the background ink. These methods are inefficient and costly, as they consume a lot of ink and/or require more press time to perform the multiple printing runs.

A more economical method is to improve the ink-transfer properties of the ink-carrying raised surface of flexo relief plates. One way to increase ink transfer properties is by adding "roughness" to the ink-carrying plate surface. Some methods for roughening the surface include applying special coatings or treatments during manufacturing of the flexo polymer plates. Such methods have the disadvantage that the roughness is not fully controllable and not flexible. Experiments have shown that optimal roughness comprises an ordered surface pattern with a frequency and shape that matches the inking system (e.g. that matches the anilox cell properties and frequency). Since the plate roughness is built into the plate by the foregoing methods, it cannot be optimally matched to the anilox properties.

Another more controlled and flexible method is to apply a surface roughness in a digital way, such as by generating a specific repeated pattern in a digital bitmap file, imaging the bitmap onto a photo-sensitive mask mounted on top of the polymer plate, and exposing this pattern through the mask onto the polymer plate, such as with UV light. A halftone screen is one basic repeated digital pattern, akin to what is normally used to represent color tints, is one such pattern. To match the anilox grid and cell size, a specific halftone dot shape, screen ruling and gray level may be selected that more-or-less matches the anilox properties. Certain dedicated and more advanced patterns are known that improve ink transfer further by better matching the anilox grid and cell properties, such as for example as described in patents and applications from Mark Samworth (e.g. U.S. Pat. No. 6,121,301, titled FLEXOGRAPHIC PRINTING PLATE HAVING IMPROVED SOLIDS RENDITION, and patents related to or referencing the same) and from Hans DeWitte (e.g. European Patent No. EP 1,557,279 and patents related to or referencing the same), incorporated herein by reference.

One disadvantage of the foregoing digital methods, however, is that the frequency, shape and size of the patterns are limited to the plate-making properties of the system in which the methods are used. For example, depending on the type of mask, the pattern may not always be imaged perfectly through the mask (because of the thickness and required energy to perforate the mask). Also, oxygen effects during UV exposure may cause less accurate reproduction of the pattern on to the polymer plate surface. Historically, exposure steps have been performed using UV light bulbs that did not distribute the UV light energy uniformly and consistently over the entire plate surface. As a result, digital surface patterns that were very small or having a high frequency were not formed well on the surface of the flexo plate. Also, the surface patterns thus created were often unstable over time or not equal over the full surface of the plate.

Fortunately, the latest developments in plate-making technology allow application of more precise structures on flexo plate surfaces. One of these developments is a special method of imaging and perforating the digital pattern on the photo-sensitive mask or laser ablated mask (LAM). In accordance with this method, the pattern in the digital file is defined by a series of set and cleared pixels. A specific sub-pattern of set pixels (2×2 checkerboard) is detected by the imaging system and triggers a high-energy laser pulse. This high-energy laser pulse causes a sharp perforation through the mask. The quantity of the high-laser energy pulse is controllable in such a way that the surface pattern formed on the finished plate has the proper relief and size. A commercial version of the foregoing is known as ESKO Pixel Boost™ technology. Exemplary methods and systems are discussed in U.S. Published Application Ser. No. US20190315141A1 ("the '141 Publication), titled METHOD FOR SMOOTHER TONAL RESPONSE IN FLEXOGRAPHIC PRINTING, incorporated herein by reference.

Another development comes from improvements to UV exposure technology. Rather than using UV light emitting bulbs, exposure using UV light emitting diodes (LEDs) allows a more controlled, uniform and precise UV exposure of the polymer layer at the mask openings. Furthermore, front and back UV exposure may be performed simultaneously, or in a deliberate sequence, delivering more accurate and stable relief depths, and minimizing oxygen issues. Such improvements in technology are discussed, for example, in U.S. Published Patent Application No. US 2018/0210345 A1, titled PROCESS AND APPARATUS FOR CONTROLLED EXPOSURE OF FLEXOGRAPHIC PRINTING PLATES AND ADJUSTING THE FLOOR THEREOF, and patents referenced therein, incorporated herein by reference.

With these new developments, finer and higher frequency surface patterns are possible on the ink-carrying surfaces of flexo plates. These higher frequency patterns allow use of inking systems with smaller ink-carrying cell grids. A more uniform printed background ink layer may therefore be obtained using less ink quantities. Some patterns perform better than others, however, and there is a need in the art for identifying optimal patterns.

SUMMARY OF THE INVENTION

One aspect of the invention comprises a method of creating a bitmap for creating a printing plate for printing ink on a substrate. The method comprises defining an area of an image intended to print with ink, applying a halftone screen to the defined area, and creating a bitmap embodying application of the halftone screen to the defined area. The defined area may be an area intended to print in solid rendition area or with halftones. The halftone screen comprises a pattern comprising plurality of dashes having a plus or minus 45-degree orientation, a plus or minus 135-degree orientation, or a combination of two or more plus or minus 45-degree and 135-degree orientations, wherein (i) each dash or component dash thereof comprises a same number (M) of two or more adjacent touching pixels in length and a same number (T) of one or more adjacent touching pixels in width, (ii) the dashes are orthogonally arranged in rows and columns; or (iii) a combination of (i) and (ii).

In some embodiments, the M is in a range of 2 to 4, and T is in a range of 1 to 3. In some embodiments, each dash comprises the same number T of pixels in width, wherein T is an odd number greater than 1, and T component single-pixel dashes in which at least one single-pixel dash comprises M+1 adjacent touching pixels in length.

In one embodiment, the halftone pattern comprises alternating columns of dashes having a plus or minus 45-degree orientation and columns of dashes having a plus or minus 135-degree orientation. In this embodiment, the topmost pixels of the dashes may have the 45-degree orientation align with the bottommost pixels of the dashes having the 135-degree orientation.

Embodiments include those in which the dashes of M pixels are grouped in diagonal lines with N pixels off between adjacent dashes in a same diagonal line, with the dashed lines offset from one another by a value of V vertical pixels. In some embodiments, M is in a range of 2 to 4, N is in a range of 2 to 4, and V is in a range of 4 to 8. In one preferred embodiment M=4, N=2, and V=6.

Another aspect of the invention comprises a computer memory media product embodying non-transitory machine readable instructions corresponding to a bitmap produced by any of the methods as disclosed herein.

Still another aspect of the invention comprises a process for creating a mask, and a mask created thereby, for use in creating a printing plate for printing ink on a substrate, the method comprising providing a bitmap created by any one of the methods as described herein, and applying the bitmap to a mask by forming a pattern of holes in the mask corresponding the bitmap. In such processes wherein T=1, the step of forming the holes may comprise ablating a portion of the mask with a laser, wherein the laser is applied with a first laser power to features in the bitmap that define a 2×2 checkerboard pattern, and the laser is applied with a second laser power to features in the bitmap that do not define a 2×2 checkerboard pattern, wherein the first power is greater than the second power. In such processes wherein T>1, the step of forming the holes may comprise ablating a portion of the mask with a laser, wherein the laser is applied with a same laser power to create each of the features defined in the bitmap.

Yet another aspect of the invention comprises a process for creating a printing plate for printing ink on a substrate, and a printing plate created thereby, the process comprising providing a printing plate having a mask created by any one of the processes described herein, exposing a printing plate to actinic radiation through the holes in the mask, thereby curing portions of the printing plate receiving the actinic radiation; and processing the plate to remove uncured areas of the plate, thereby creating raised areas in the plate corresponding to the halftone screen in the portion of the plate corresponding to the defined area of the image.

A still further aspect of the invention comprises a method of printing, comprising providing a printing plate produced by any one of the processes as described herein, applying a first ink to the printing plate; and transferring the first ink to a substrate as a first ink layer in an area of the substrate corresponding to the defined area of the image. The ink transferred to the substrate in the area corresponding to defined area may be a background color, in which the method further comprises printing with at least a second ink over the first ink layer. The method may include printing on a substrate that is transparent or translucent, and may particularly include printing with a white ink.

Another aspect of the invention comprises a system for creating a printing plate, the system comprising a computer processor and digital memory, accessible to the computer processor, that embodies non-transitory machine-readable instructions for performing any of the methods of creating a bitmap as described herein. An imager, controllable by the processor, is configured to apply the bitmap to a mask by forming a pattern of holes in the mask corresponding the bitmap. An exposure unit, optionally controlled by the processor, is configured to expose a photopolymer plate to actinic radiation through the mask. One or more post-exposure units, such as a washing unit, is configured to remove uncured photopolymer from the printing plate. The imager may comprise a laser for forming the holes in the mask, in which case the system is configured to apply a first, relatively greater laser power to features in the bitmap that define a 2×2 checkerboard pattern, and to apply a second, relatively lesser, laser power to features in the bitmap that do not define a 2×2 checkerboard pattern.

BRIEF DESCRIPTION OF THE DRAWINGS

FIG. 8A depicts a plan view of an exemplary portion of a digital file having a dashed line pattern.

FIG. 8B depicts a plan view of an exemplary portion of the mask created from the digital file of FIG. 8A.

FIG. 8C depicts a cross sectional view of a portion of an exemplary printing plate created from the mask of FIG. 8B.

FIG. 8D depicts the cross sectional view of the portion of the exemplary printing plate of FIG. 8C, bearing ink for transfer onto a substrate.

FIG. 11 is an illustration of an exemplary system according to one aspect of the present invention.

DETAILED DESCRIPTION OF THE INVENTION

Aspects of the invention include systems and methods for obtaining a uniform ink layer, such as for use as a background color in flexographic surface printing. Specific fine 3D structures extending to the raised surface of a flexo relief plate give a roughness to the ink carrying surface of the plate, giving a more optimal ink transfer from inking system to substrate, resulting in a more uniform printed ink layer without un-inked spots or pin-holing.

Figure 1C:
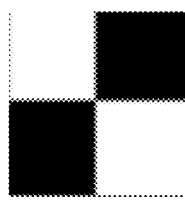
FIG. 1C depicts a first exemplary 2×2 checkerboard pattern.
Figure 1D:
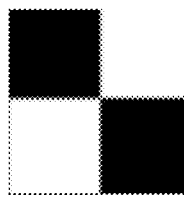
FIG. 1D depicts a second exemplary 2×2 checkerboard pattern.
Figure 1B:
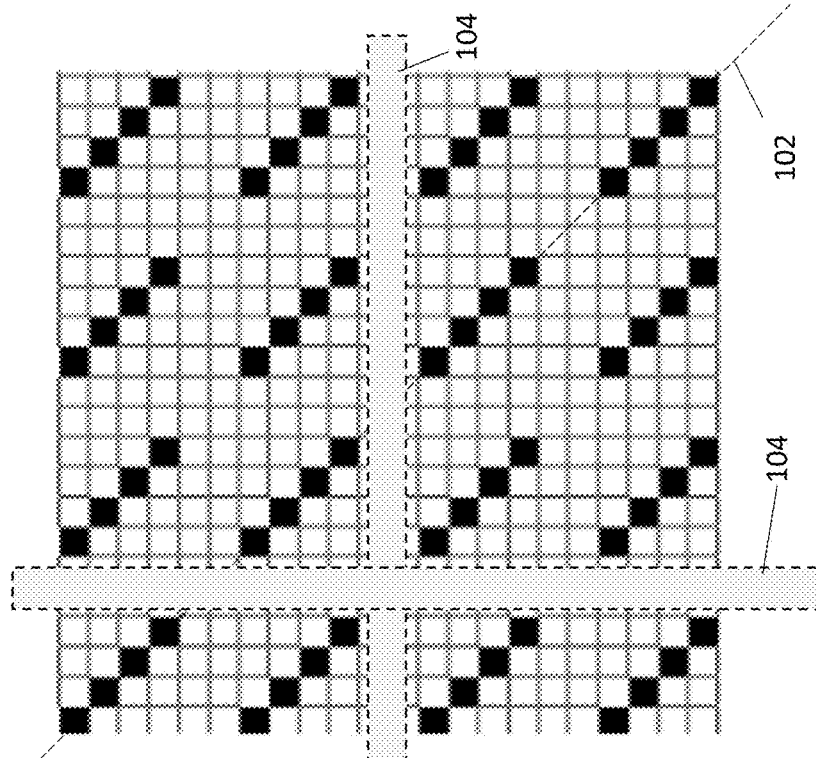
FIG. 1B depicts a bitmap of an exemplary surface screen with the "EXP3" pattern in a 135 degree orientation.
Figure 1A:
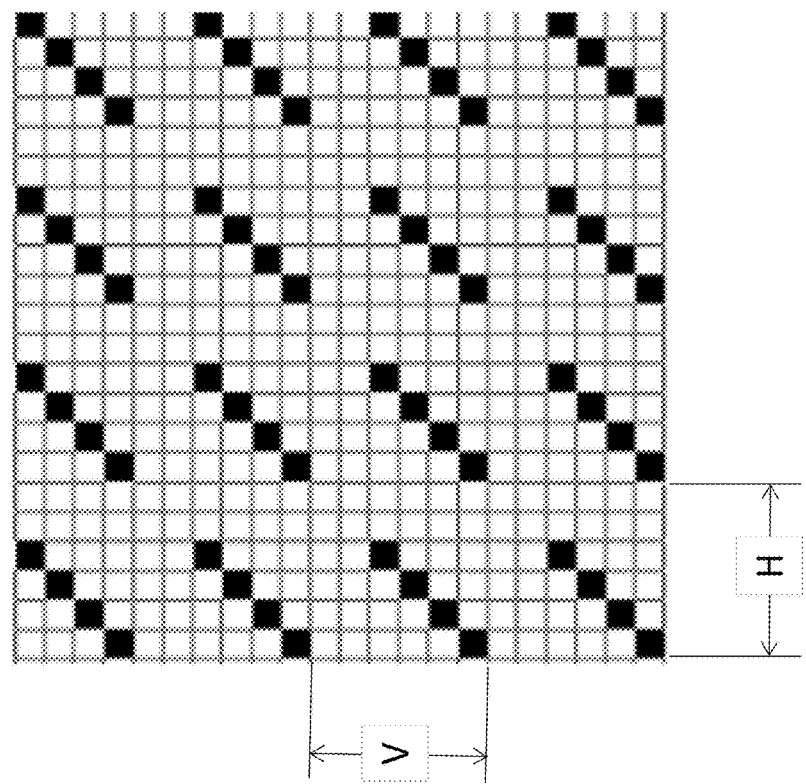
FIG. 1A depicts a bitmap of an exemplary surface screen having an exemplary 4-pixel-on single pixel dashed line pattern, referred to herein as "EXP3," having a 45 degree orientation.

One embodiment comprises applying a surface screen to a solid ink area, in which the surface screen comprises a dedicated pattern composed of a repetition of dashed lines at 45- or 135-degree orientations, such as the pattern depicted in FIG. 1A and the pattern depicted in FIG. 1B, respectively. As used herein, the "45 degree orientation" and "135 degree orientation" refer to an angle formed between a line drawn through the "on" pixels and an axis extending horizontally to the right. Notably, a screen with a 45-degree orientation is a mirror image of the same pattern at a 135-degree angle, and vice versa.

FIGS. 1A and 1B depict the digital file (bitmap) corresponding to exemplary surface screens as described herein. These surface screens are applied to a solid rendition area (an area intended for printing a solid color). Referring now to FIG. 8A, in the context of "surface screening" as discussed herein, each black pixel line-piece 802 in the digital file 800 results in microscopic small line-piece openings 812 in the mask 810, after imaging. These small openings result in line-piece curing on the plate, that after the non-cured parts are washed away, leave small, thin microscopic gaps or "engravings" 824 on the ink carrying surface area of the plate 820 between the imaged line-piece features 822. The close spacing and high resolution of the imaged line-piece features mean that these gaps between the imaged features do not extend to the floor 826 of the plate, but are raised areas themselves relative to the plate floor, but at a height slightly less than the imaged features. These microscopic engravings 824 cause the ink 828 to stick much better and more evenly on the whole raised area of the plate, making for a more even ink coating transferred to the substrate 830 to which the ink is applied.

Pattern 100 comprises single-pixel dashed lines oriented at a 45-degree angle with four (4) pixels on and two (2) pixels off (which can also be expressed as 4-pixel dashes having a horizontal offset H of six (6) pixels between corresponding pixels of horizontally adjacent dashes), with adjacent lines (and adjacent vertical dashes) having a vertical offset V of six (6) pixels. An "offset" of six (6) pixels results in a gap of five (5) "off" pixels between similarly positioned "on" pixels. Pattern 110 comprises single-pixel dashed lines oriented at a 135-degree angle with four (4) pixels on and two (2) pixels off, and adjacent lines offset by six (6) pixels. These patterns are referenced herein as the "EXP3" pattern. Another way of considering this pattern, is that it comprises a series of continuous diagonal lines 102, such as the grooves described in EP 1,557,279, in which strokes 104 of 2-pixel thickness have been applied in vertical and horizontal directions turning off any on pixels, thus breaking the continuous lines into dashed lines.

For dashed lines with a thickness of a single pixel, an exemplary process includes imaging the digital patterns on the photo-sensitive mask (LAM) on top of a flexo plate, using a special imaging mode that triggers a laser boost at positions where a 2×2 pixel checkerboard pattern, such as depicted in FIG. 1C or 1D, is detected (i.e. using Esko Pixel Boost™ technology, sometimes referred to as "P+" herein). For dashed lines having a thickness of two or more pixels, the process includes imaging the digital patterns using a standard (non-boosted) imaging mode onto a mask. A photopolymer printing plate is then exposed using a UV LED exposure system through the mask to cure (e.g. crosslink) the photopolymer in exposed areas. The mask and the uncured polymer structures are washed away, leaving the requested roughness pattern on top of the relief plate.

The effect of different surface patterns on the hiding capacity of white ink was evaluated using patterns created by the foregoing imaging and exposure steps. Hiding capacity was evaluated using two metrics: printing opacity and mottle. The printing opacity metric indicates how much background light is blocked by the printed ink layer and may be measured with a spectrophotometer or a densitometer. The mottle metric is a measure of uniformity of the ink layer and is measured by digitally scanning an ink layer and processing the scanned data with a digital processor. For example, readings taken with a Flex3Pro plate analyzer and processed using Fleye Software, both from Peret GmbH, can provide a repeatable metric using the Mottle function. Opacity is another useful metric for distinguishing and comparing the effectiveness of different types of surface screening.

Figure 2B:
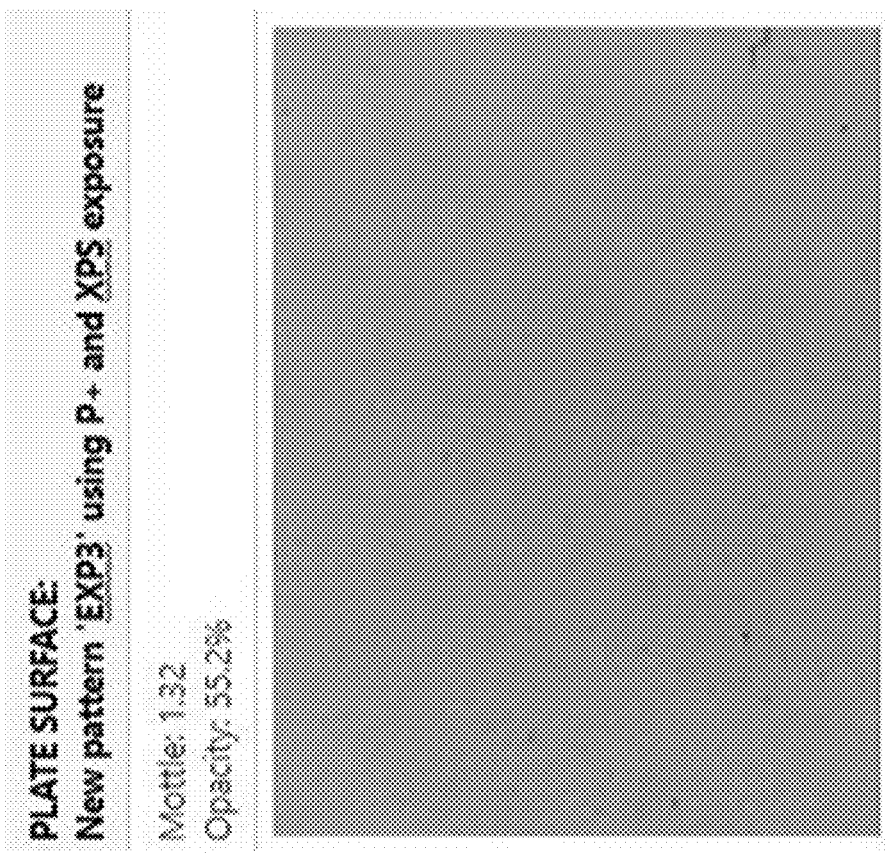
FIG. 2B depicts a microscopic image capture of a similar transparent substrate printed with similar white ink and placed on a similar black background reference paper as for FIG. 2A, but wherein the printing was performed with a printing plate created with application of the EXP3 surface screen as described herein.
Figure 2A:
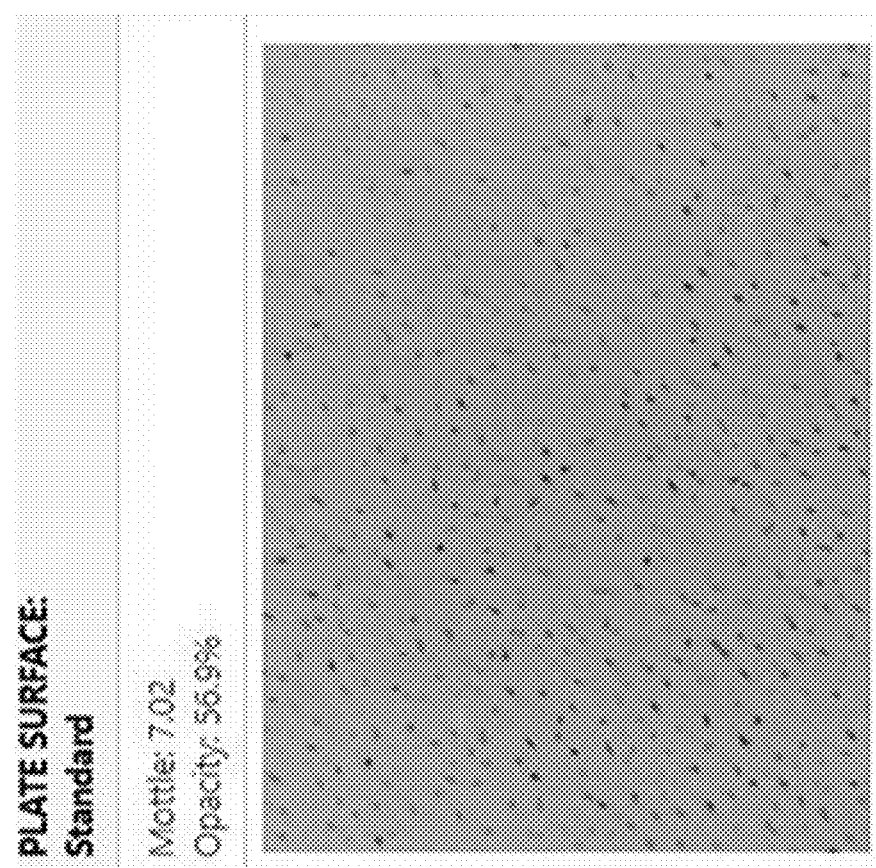
FIG. 2A depicts a microscopic image capture of a transparent substrate printed with white ink and placed on a black background reference paper, wherein the printing was performed with a standard printing plate created without application of a surface screen as described herein.

Although printing opacity is commonly used as the metric that expresses the hiding quality of an ink layer, research showed that this metric does not fully expresses the hiding capacity of background ink. Referring now to the images depicted as FIGS. 2A and 2B, both of which are microscopic image captures of a substrate printed with white ink and placed on a black background reference paper. FIG. 2A corresponds to an ink layer laid down by a solid plate surface without application of a surface screen, such as one of the screens as discussed herein, to the solid ink area. FIG. 2B corresponds to a plate surface with surface screening, using an EXP3 pattern as described herein, imaged with P+ imaging and exposed using Esko XPS™ technology (LED UV) exposure. In FIG. 2A, numerous black spots from the black background paper are visible through the white ink layer, and the white inked areas surrounding the black pinholes have different color densities. In FIG. 2B, relatively fewer black spots are visible and the white ink color is more uniform. However, the measured printed opacity of FIG. 2A was higher than for FIG. 2B. The mottle measurement, on the other hand, is much lower for FIG. 2B than for FIG. 2A. The ink coverage shown in FIG. 2B is preferred because the background color is uniform and will have less interference with multi-color artwork printed on top of it.

Figure 3A:
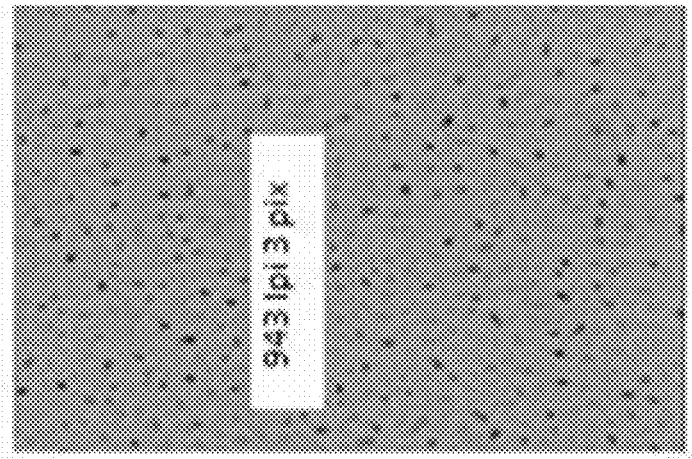
FIG. 3A depicts a magnified microscopic image capture of a transparent substrate printed with white ink and placed on a black background reference paper wherein the printing was performed with a printing plate created with application of a surface screen comprising a 3-pixel thick linear pattern.
Figure 3B:
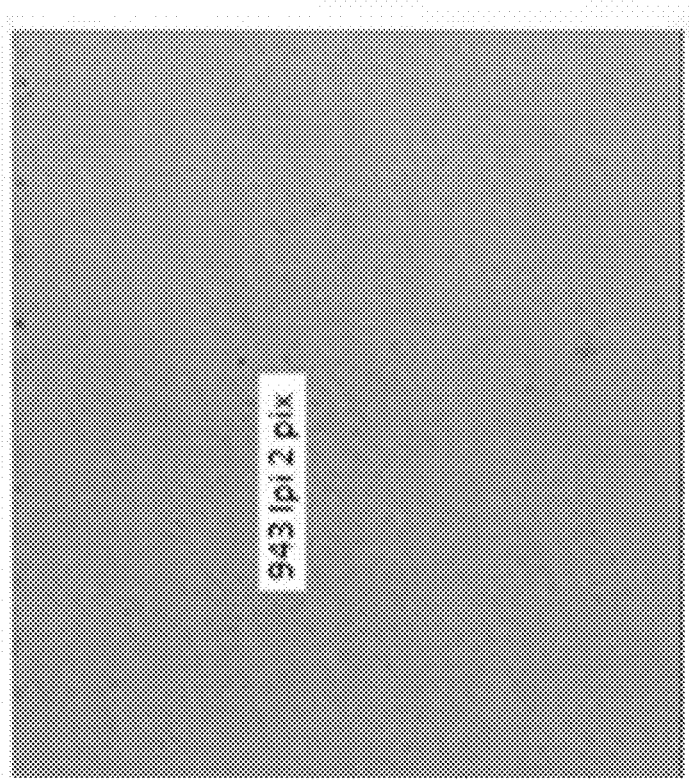
FIG. 3B depicts a magnified microscopic image capture of a transparent substrate printed with white ink and placed on a black background reference paper all similar to that for FIG. 3A, but wherein the printing was performed with a printing plate created with application of the 2-pixel linear pattern as depicted in FIG. 3C.
Figure 3C:
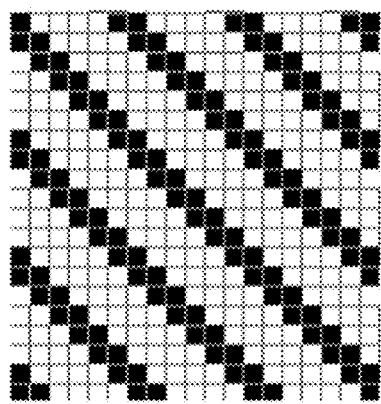
FIG. 3C depicts a bitmap of an exemplary surface screen comprising a 2-pixel linear pattern at 943 lpi.

The result of the research further showed that using very fine line structures reduced mottle considerably. FIGS. 3A and 3B show microscopic captures of white ink printed using two different line patterns. FIG. 3A was printed using a repetition of lines at 943LPI, each line having a thickness of 3 pixels. FIG. 3B was printed using the same repetition but with lines having a thickness of 2 pixels, such as the screen depicted in FIG. 3C. The capture shown in FIG. 3B, printed with the finer lines, clearly shows less mottle and pinholing.

Figure 7C:
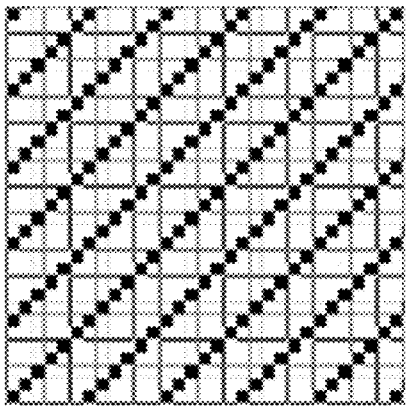
FIGS. 7A-7E depict respective surface pattern applied in experiments used for compiling the data of Tables 1-6.
Figure 7B:
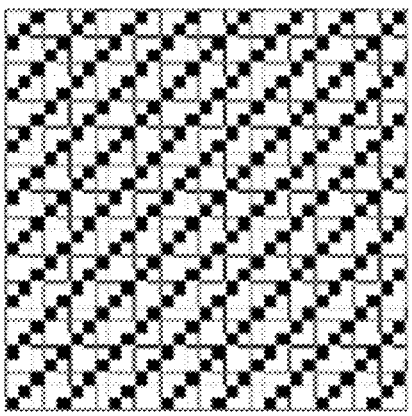
Figure 7E:
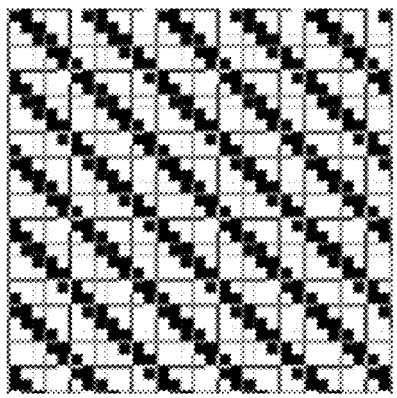
Figure 7A:
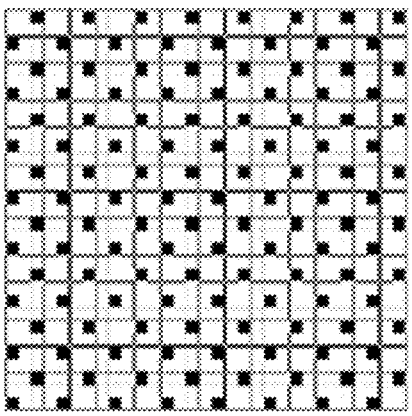
Figure 7D:
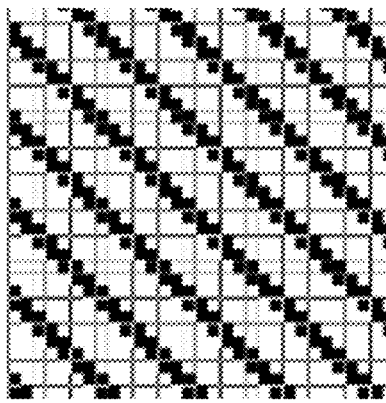

Further research also revealed best results when the frequency of the line pattern matched the anilox cell frequency. TABLES 1-6 provide an overview of mottle measurements obtained from patches using different surface structures and frequencies. The surface structures on the plates were all obtained by using P+ imaging and ESKO XPS UV LED exposure. The patches were printed with different white ink types (NC=NitroCellulose ink, PU=Polyurethane ink), using different plate types—MacDermid ITP, Asahi AFP—TOP, DuPont™ Cyrel® DPR—and different anilox L/cm properties, all at a constant speed (300 M/min). The rightmost columns in the tables labeled "Solid" are mottle values from patches without surface patterns. The remaining columns refer to patterns as depicted in the figures. For example, the MCWSI pattern is depicted in FIG. 7A, the MG34 pattern in FIG. 7B, the MG56 pattern in FIG. 7C. Columns labeled 471 through 942 refer to the frequency of a line pattern (e.g. from 471 LPI to 942 LPI), such as the pattern depicted in FIG. 7D corresponding to 808 LPI, and the pattern depicted in FIG. 7E corresponding to a 942 LPI. The rows labeled 100 to 180 indicate anilox cell frequencies from 100 LPI to 180 LPI. The least mottle value corresponds to the most uniform ink layer.

The tables show that patterns with higher line frequency perform better when used with higher anilox cell frequencies. The performance of the pattern labeled "EXP3" (corresponding to the pattern shown in FIG. 1A) surprisingly exceeded the others, in that the mottle values are very low for the complete range of anilox cell frequencies. Accordingly, this pattern showed less dependence on the anilox cell frequency compared to other patterns, making this pattern particularly useful.

Using the EXP3 pattern, printing opacity may be adjusted independent of mottle, meaning that changing inking type or inking quantities (changing anilox grid and cell size) allow a user to adjust opacity or color without increasing mottle or introducing pin-holing.

TABLE 1

| Plate: MacDermid ITP; Ink: NC | | | | | | | | | | | |
| --- | --- | --- | --- | --- | --- | --- | --- | --- | --- | --- | --- |
| Anilox L/cm | MCWSI | MG34 | MG56 | EXP3 | 471 | 512 | 565 | 628 | 707 | 808 | 942 | solid |
| 100 | 2.03 | 2.61 | 2.45 | 0.12 | 4.91 | 2.38 | 0.07 | 0.07 | 0.21 | 0.62 | 0.12 | 2.67 |
| 120 | 3.91 | 4.92 | 2.69 | 0.12 | | | 1.80 | 0.19 | 0.13 | 0.09 | 1.58 | 4.49 |
| 140 | 6.11 | 8.78 | 3.00 | 0.38 | | | 3.21 | 0.69 | 0.06 | 0.09 | 0.78 | 5.66 |
| 160 | 5.77 | 7.65 | 3.17 | 0.26 | | | | | 0.42 | 0.20 | 0.19 | 6.03 |
| 180 | 2.05 | 9.66 | 2.49 | 0.18 | | | | | 4.90 | 0.98 | 0.85 | 7.40 |

TABLE 2

Plate: MacDermid ITP; Ink: PU

| Anilox L/cm | MCWSI | MG34 | MG56 | EXP3 | 471 | 512 | 565 | 628 | 707 | 808 | 942 | solid |
|---|---|---|---|---|---|---|---|---|---|---|---|---|
| 100 | 0.28 | 0.27 | 2.36 | 0.18 | 7.86 | 7.14 | 0.24 | 0.06 | 0.05 | 0.28 | 0.25 | 1.35 |
| 120 | 6.21 | 5.20 | 2.84 | 0.09 | | | 2.70 | 0.05 | 0.04 | 0.06 | 0.34 | 2.07 |
| 140 | 4.26 | 5.24 | 3.90 | 0.37 | | | 3.12 | 1.48 | 0.15 | 0.11 | 0.74 | 4.64 |
| 160 | 8.80 | 7.70 | 3.93 | 0.09 | | | | | 0.25 | 0.07 | 0.57 | 3.04 |
| 180 | 1.85 | 5.59 | 2.26 | 0.06 | | | | | 1.26 | 0.28 | 0.25 | 3.42 |

TABLE 3

Plate: Asahi AFP-TOP; Ink: NC

| Anilox L/cm | MCWSI | MG34 | MG56 | EXP3 | 471 | 512 | 565 | 628 | 707 | 808 | 942 | solid |
|---|---|---|---|---|---|---|---|---|---|---|---|---|
| 100 | 6.53 | 4.71 | 4.83 | 0.97 | 8.92 | 7.26 | 0.74 | 0.10 | 0.06 | 0.77 | 2.13 | 6.88 |
| 120 | 7.86 | 12.40 | 4.16 | 1.32 | | | 0.60 | 0.18 | 0.05 | 1.12 | 1.79 | 7.02 |
| 140 | 11.83 | 15.15 | 8.89 | 0.56 | | | 4.77 | 3.83 | 0.11 | 0.13 | 2.81 | 8.22 |
| 160 | 10.73 | 9.26 | 11.19 | 1.06 | | | | | 2.73 | 1.01 | 0.55 | 6.39 |
| 180 | 3.92 | 9.47 | 4.62 | 0.36 | | | | | 13.33 | 6.58 | 0.98 | 9.26 |

TABLE 4

Plate: Asahi AFP-TOP; Ink: PU

| Anilox L/cm | MCWSI | MG34 | MG56 | EXP3 | 471 | 512 | 565 | 628 | 707 | 808 | 942 | solid |
|---|---|---|---|---|---|---|---|---|---|---|---|---|
| 100 | 0.81 | 1.82 | 0.06 | 0.03 | 0.68 | 0.22 | 0.02 | 0.03 | 0.04 | 0.05 | 0.07 | 0.78 |
| 120 | 0.99 | 3.28 | 0.22 | 0.03 | | | 0.07 | 0.11 | 0.04 | 0.03 | 0.03 | 1.32 |
| 140 | 1.11 | 2.24 | 0.18 | 0.10 | | | 1.01 | 0.44 | 0.04 | 0.03 | 0.02 | 3.08 |
| 160 | 0.51 | 2.19 | 0.20 | 0.14 | | | | | 0.24 | 0.16 | 0.03 | 2.34 |
| 180 | 0.55 | 1.47 | 0.06 | 0.06 | | | | | 0.29 | 0.10 | 0.04 | 3.12 |

TABLE 5

Plate: DuPont ™ Cyrel ® DPR; Ink: NC

| Anilox L/cm | MCWSI | MG34 | MG56 | EXP3 | 471 | 512 | 565 | 628 | 707 | 808 | 942 | solid |
|---|---|---|---|---|---|---|---|---|---|---|---|---|
| 100 | 0.40 | 0.13 | 0.03 | 0.02 | 0.41 | 0.27 | 0.02 | 0.02 | 0.07 | 0.02 | 0.01 | 0.07 |
| 120 | 0.40 | 1.62 | 0.03 | 0.04 | | | 0.03 | 0.04 | 0.01 | 0.03 | 0.07 | 0.73 |
| 140 | 1.43 | 1.93 | 0.04 | 0.05 | | | 0.06 | 0.03 | 0.03 | 0.04 | 0.04 | 1.39 |
| 160 | 0.89 | 2.30 | 0.05 | 0.05 | | | | | 0.05 | 0.03 | 0.03 | 0.97 |
| 180 | 0.30 | 1.09 | 0.06 | 0.09 | | | | | 0.05 | 0.05 | 0.03 | 0.45 |

TABLE 6

Plate: DuPont ™ Cyrel ® DPR; Ink:PU

| Anilox L/cm | MCWSI | MG34 | MG56 | EXP3 | 471 | 512 | 565 | 628 | 707 | 808 | 942 | solid |
|---|---|---|---|---|---|---|---|---|---|---|---|---|
| 100 | 0.26 | 0.44 | 0.10 | 0.03 | 0.53 | 0.13 | 0.01 | 0.03 | 0.02 | 0.01 | 0.02 | 0.05 |
| 120 | 1.18 | 1.12 | 0.12 | 0.01 | | | 0.03 | 0.02 | 0.02 | 0.02 | 0.02 | 0.34 |
| 140 | 0.71 | 2.60 | 0.47 | 0.03 | | | 0.10 | 0.04 | 0.04 | 0.03 | 0.07 | 0.44 |
| 160 | 0.50 | 2.32 | 0.26 | 0.03 | | | | | 0.06 | 0.05 | 0.02 | 0.98 |
| 180 | 0.16 | 1.34 | 0.23 | 0.05 | | | | | 0.07 | 0.06 | 0.03 | 0.84 |

In use, first a digital artwork design (e.g. a PDF file) is created that identifies one or more solid areas to be printed with a specific background ink. The design is separated into different bi-level bitmaps in a raster image processor (RIP). Each separation is intended for imaging one flexo plate, for printing one specific process color. The separation generated by the RIP for the background ink includes the identified solid areas painted with the desired specific digital pattern.

Exemplary Patterns

Preferred digital patterns are constructed from groups of connecting pixels that form a multi-pixel line segment (i.e. a "dash") at a 45 degree orientation, a 135 degree orientation, or a combination thereof. Each group of connecting pixels may comprise a series of single pixels, and in some embodiments, the multi-pixel line segments may be aligned to form dashed lines with a constant repeat between adjacent dashes in the same line, and another constant repeat between dashed lines.

When using lines having a single-pixel thickness, the ESKO CDI Power Boost (P+) technology is capable of detecting the 2×2 pixel checkerboard patterns inherent in each line. At every location in the bi-level bitmap where the 2×2 checkerboard is constructed, the laser CDI P+ system ignites a high-energy laser pulse on the LAM layer of the flexo plate, causing the LAM layer to ablate at that specific location, resulting in a transparent spot at that location. The digital pattern as depicted in FIGS. 1A and 1B comprise a plurality of such 2×2 pixel checkerboard patterns, so when the bi-level bitmap used by the CDI P+ technology contains such areas with the specific pattern, these areas automatically result in precisely dashed line openings on the mask.

A UV LED system is then used for exposing the flexo plate with UV light with precise and constant energy uniformly spread over the plate. The UV light that passed through the mask openings hardens the polymer structures in the areas of the plate corresponding to the holes in the mask, thus forming the dashed relief structures embodying the raised parts of the flexo plates after processing the plates to wash away uncured polymer.

The repeated dashed lines with single-pixel thickness as shown are not limited to the repeat distances and dash frequencies depicted. Embodiments with the orientation of the lines at 135 degrees, as depicted in FIG. 1B, are generally equivalent to patterns at 45 degrees, as depicted in FIG. 1A.

In other embodiments, imperfection during imaging of the imaging device (optical aberration, imaging direction and skew, and the like) may lead to suboptimal imaging for a single orientation pattern. Thus, in some embodiments, a pattern may be used that mixes the 45- and 135-degree orientations, such as patterns 400, 410, 420, and 430 depicted in FIGS. 4A, 4B, 4C and 4D.

Figure 4E:
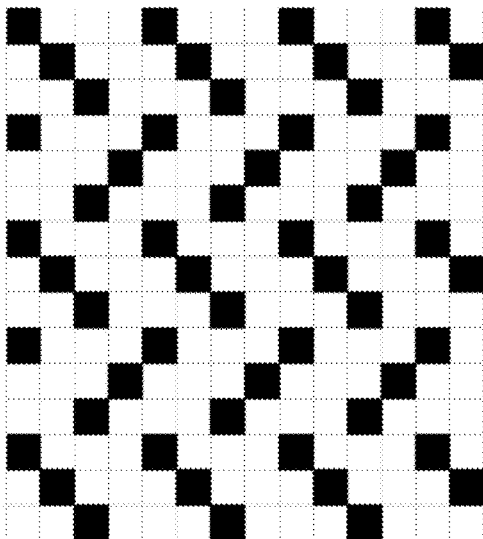
FIG. 4E depicts an a bitmap of an exemplary surface screen comprising a combination of 3-pixel-on single pixel dashes at 45- and 135-degree orientations, with same orientation dashes stacked in columns having a 4-pixel offset, with alternating columns of different orientations in which the topmost pixels align with the bottommost pixels of oppositely oriented dashes.
Figure 4C:
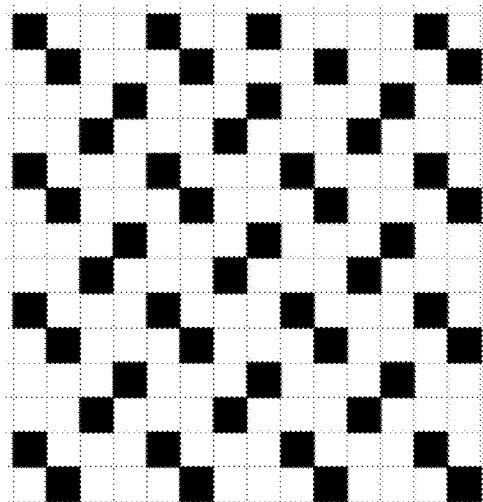
FIG. 4C depicts a bitmap of an exemplary surface screen comprising a combination of intermeshed 2-pixel-on-2-pixel-off single pixel dashed lines at 45- and 135-degree orientations.
Figure 4D:
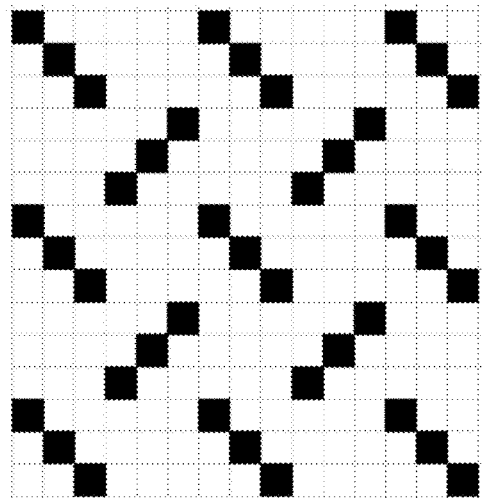
FIG. 4D depicts a bitmap of an exemplary surface screen comprising a combination of intermeshed 3-pixel-on-3-pixel-off single pixel dashed lines at 45- and 135-degree orientations.
Figure 4A:
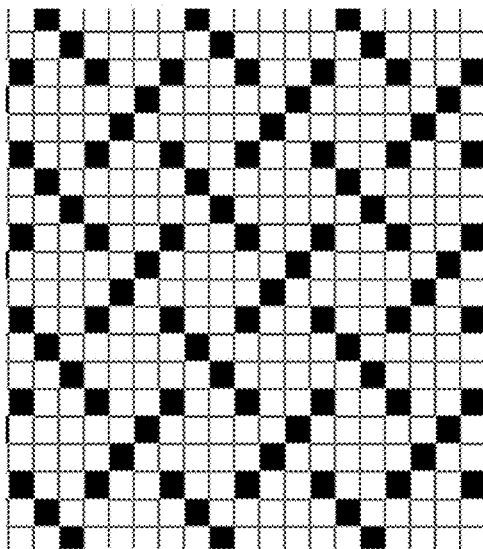
FIG. 4A depicts a bitmap of an exemplary surface screen comprising a combination of intermeshed 4-pixel-on-2-pixel-off single pixel dashed lines at 45- and 135-degree orientations.
Figure 5B:
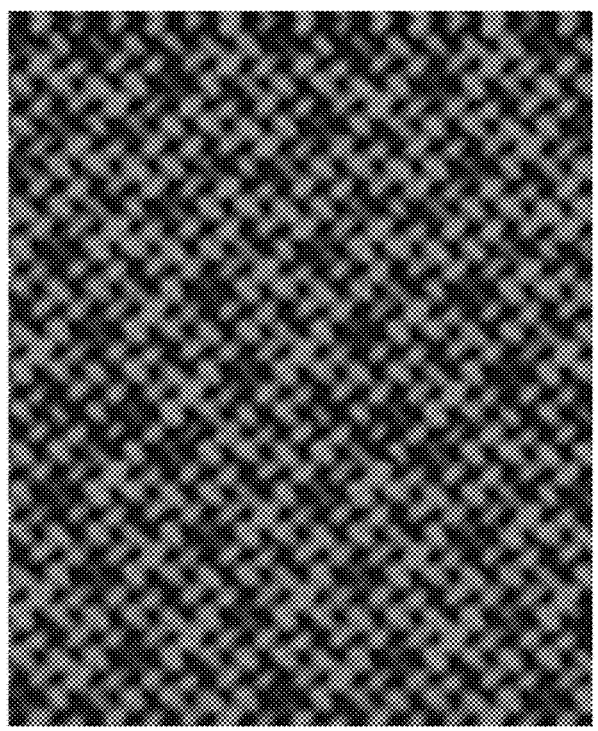
FIG. 5B depicts a magnified microscopic image capture of a printing plate embodying the surface screen of FIG. 4C.
Figure 5A:
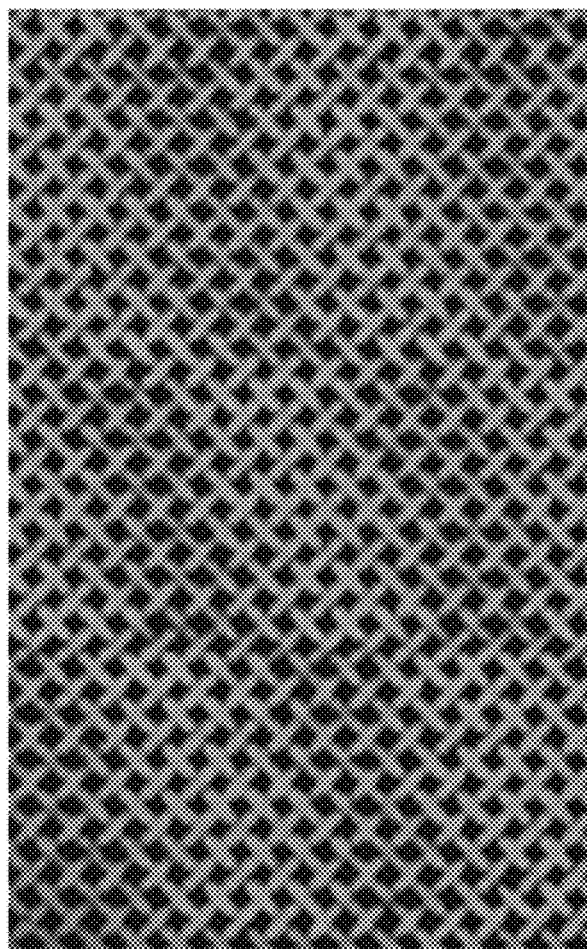
FIG. 5A depicts a magnified microscopic image capture of a printing plate embodying the surface screen of FIG. 4A, in which lighter areas represent raised, ink carrying areas and darker areas represent non-ink-carrying areas.

In the surface screen pattern depicted in FIG. 4A, each dashed line comprises four (4) pixels "on" and two (2) pixels "off," with same orientation lines having a vertical offset of 6 pixels, with opposite orientation lines intermeshed so that the dashes of one orientation are centered in the spaces between dashes of the opposite orientation. Another way of expressing a 4-pixel-on-2-pixel-off design, is to characterize adjacent dashes in the same orientation aligned along a common line as having a 2×2 square of pixels positioned between them. FIG. 5A depicts a magnified microscopic image capture of a resulting printing plate, in which white areas correspond to raised, ink-carrying areas of the plate, and dark areas correspond to non-ink-carrying areas of the plate.

Figure 4B:
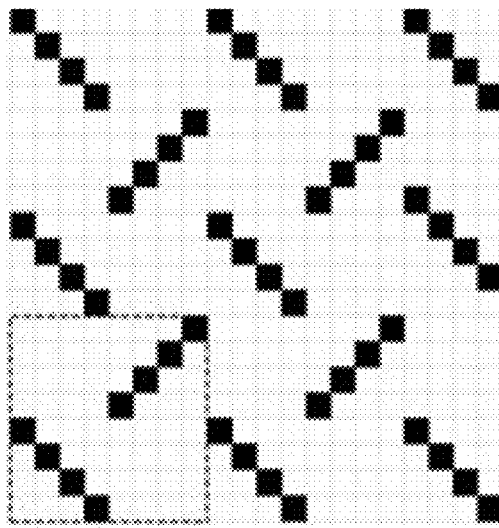
FIG. 4B depicts a bitmap of an exemplary surface screen comprising a combination of intermeshed 4-pixel-on-4-pixel-off single pixel dashed lines at 45- and 135-degree orientations.

In the surface screen pattern depicted in FIG. 4B, each dashed line comprises four (4) dashes on and four (4) dashes off (adjacent dashes in the same orientation aligned along a common line have a 4×4 square of pixels positioned between them), with a vertical offset of eight (8) pixels between same orientation lines, and opposite orientation lines intermeshed so that dashes of one orientation are centered in the spaces between dashes of the opposite orientation.

In the surface screen pattern depicted in FIG. 4C, the pattern comprises two pixels on and two pixels off (adjacent dashes in the same orientation aligned along a common line have a 2×2 square of pixels positioned between them), with same orientation lines offset by 4 vertical pixels (i.e. having a gap of three vertical pixels therebetween), and opposite orientation lines intermeshed so that dashes of one orientation are centered in the spaces between dashes of the opposite orientation. FIG. 5B depicts a magnified microscopic image capture of surface of a portion of a resulting printing plate created after application of the pattern to the bitmap corresponding to a solid rendition area, in which white areas correspond to raised, ink-carrying areas of the plate, and dark areas correspond to non-ink-carrying areas of the plate.

In the surface screen pattern depicted in FIG. 4D, the pattern comprises three pixels on and three pixels off (adjacent dashes in the same orientation aligned along a common line have a 3×3 square of pixels positioned between them), with same orientation lines offset by 6 vertical pixels (i.e. having a gap of 5 vertical pixels therebetween), and opposite orientation lines intermeshed so that dashes of one orientation are centered in the spaces between dashes of the opposite orientation.

Although depicted in many of the figures in embodiments in which the dashed line segments are aligned with one another to form diagonal lines that have 45- or 135-degree angles, it should be understood that variations may be provided in which the line segments do not form such lines. For example, dashes may be distributed in columns in which the dashes of adjacent columns of the same orientation do not align to form lines with one another. FIG. 4E depicts such a surface screening pattern. The pattern depicted in the exemplary embodiment of FIG. 4E comprises dashes of three pixels each, with adjacent dashes in the same orientation not aligned along a common lines, and having a 1×3 group of pixels positioned between them. Another way of expressing this pattern is to say that same-orientation dashes are distributed in columns three-pixels wide, with same orientation lines offset by 4 vertical pixels (thus leaving a gap of 3 vertical pixels) between corresponding points of dashes in the same column. Columns of differently oriented pixels are alternated, with opposite orientation dashes aligned so that the topmost pixel of each dash in one orientation dash aligns horizontally with the bottommost pixel of adjacent dashes of the opposite orientation.

Figure 6A:
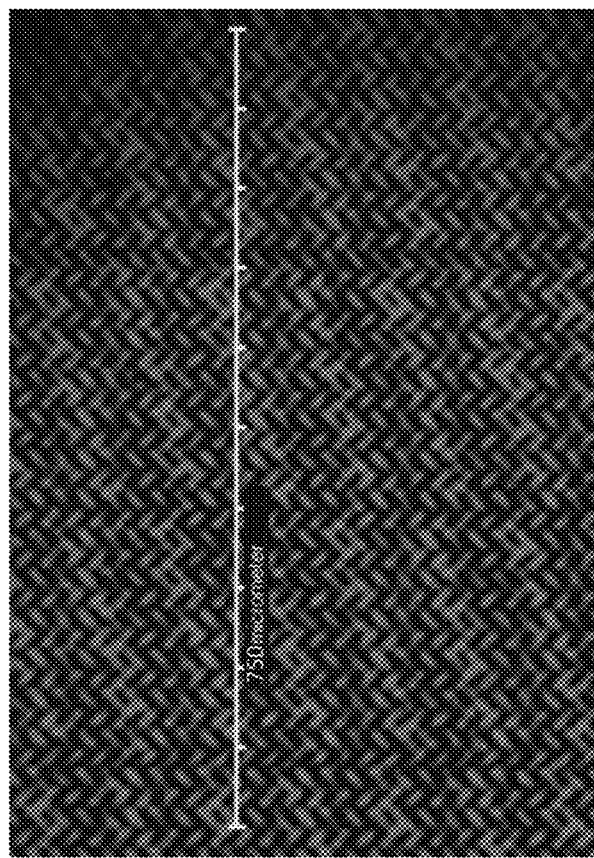
FIG. 6A depicts a magnified microscopic image capture of a printing plate embodying the surface screen of FIG. 4D, wherein the features on the mask for creating the plate were imaged with relatively lesser pulse energy than the plate depicted in FIG. 6B.
Figure 6B:
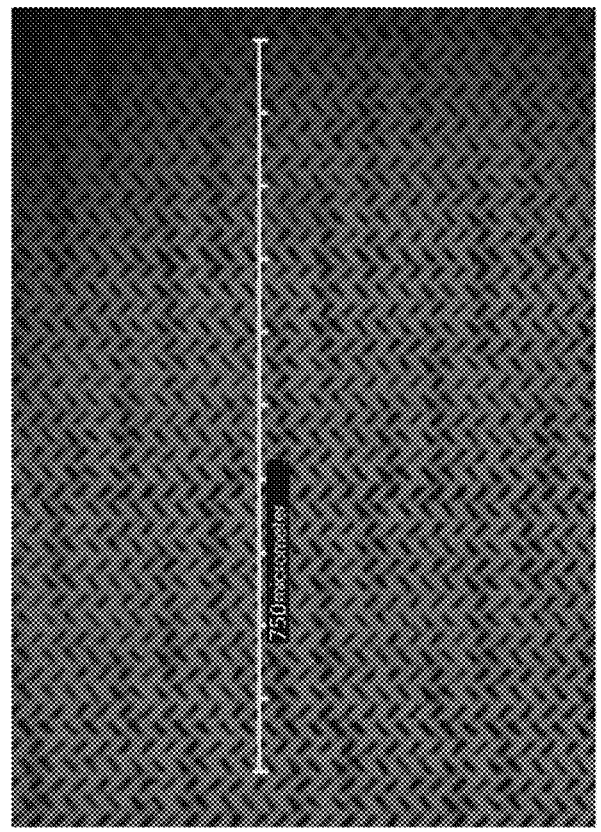
FIG. 6B depicts a magnified microscopic image capture of a printing plate embodying the surface screen of FIG. 4D, wherein the features on the mask for creating the plate were imaged with relatively greater pulse energy than the plate depicted in FIG. 6A.

FIGS. 6A and 6B each depict a magnified microscopic image capture of surface of a portion of a resulting printing plate created after application of the surface screening of FIG. 4E, in which white areas correspond to raised, ink-carrying areas of the plate, and dark areas correspond to non-ink-carrying areas of the plate. The lines shown in both figures correspond to a distance of 750 micrometers, to show scale. The plate portion depicted in FIG. 6A was created from a mask that was imaged using a first pulse amplitude and a first pulse width and the plate portion depicted in FIG. 6B was created from a mask that was imaged using the first pulse amplitude and a second pulse width that was relatively greater than the first pulse width (meaning that the mask corresponding to FIG. 6B received more laser energy per imaged feature than the mask corresponding to FIG. 6A).

As noted above with respect to Table 1, a match between pattern size and anilox cell line count may optimize print performance. Accordingly, screens may be provided in species of single and double orientation designs that vary in size to optimize the match with anilox line count.

In some embodiments, the repeated dashed lines may have a thickness of multiple pixels with the repeat distance increased relative to single-pixel patterns so that the empty space between the dashed lines is at least larger than the thickness of the dashed line. In this embodiment, standard image technology may be used instead of the CDI P+ technology. FIG. 9A depicts a bitmap of an exemplary dashed line pattern having a 2-pixel thickness, and FIG. 9B depicts a bitmap of an exemplary dashed line pattern having a 3-pixel thickness.

As arranged in FIG. 9A, each dash comprises a total of 8 pixels: 4 pixels on the diagonal, 2 pixels wide (e.g. essentially two single-pixel component dashes of 4 pixel length, side by side). Thus, as used herein, "thickness" refers to the number of single-pixel dashes of the same size grouped side-by-side. Each of the two side-by-side single-pixel component dashes of 4 pixel length have a gap of 2 off pixels between on-pixels in the same line, and an offset of 6 horizontal pixels horizontally (creating a gap of 4 off pixels horizontally between each 2-pixel thickness dashes). The dashes align in columns with a single pixel space between columns, and rows with a double pixel space between rows. As used herein the term "component dash" refers to a single-pixel dash that together with other single-pixel dashes formed by adjacent touching pixels form a dash having a multi-pixel thickness. "Adjacent touching pixels" as used herein, refers to pixels that share a common side or have vertices that share a common point at their respective corners. Thus, each pixel has 8 adjacent touching pixels, as that term is used herein.

Figure 9B:
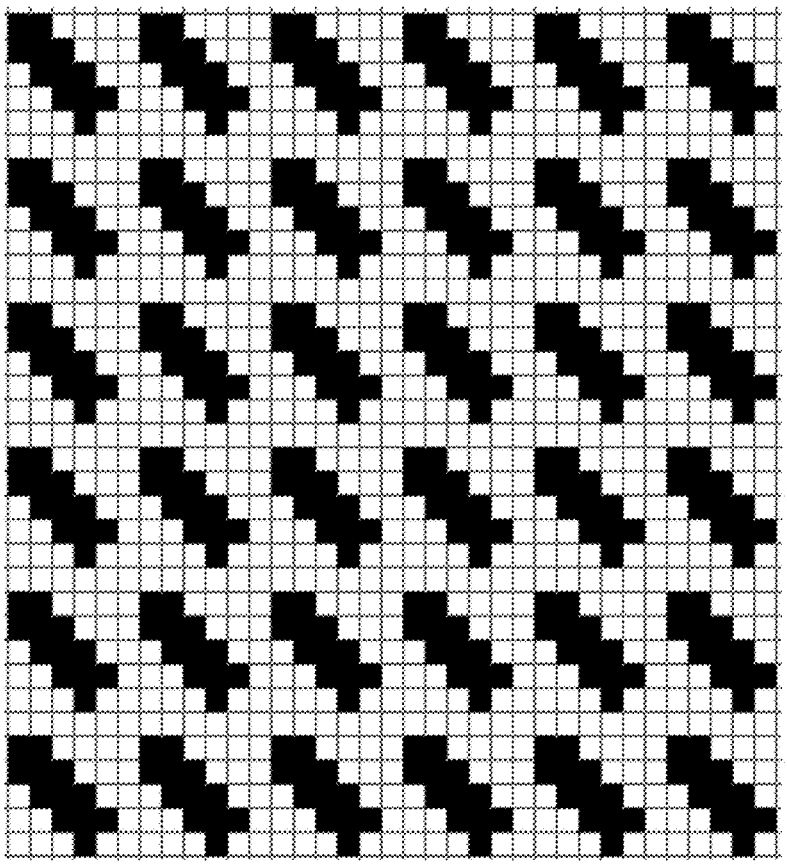
FIG. 9B depicts a bitmap of an exemplary surface screen comprising a dashed line pattern comprising lines of 3-pixel thickness formed of adjacent 4-pixel-long, single-pixel-thick component dashes.
Figure 9A:
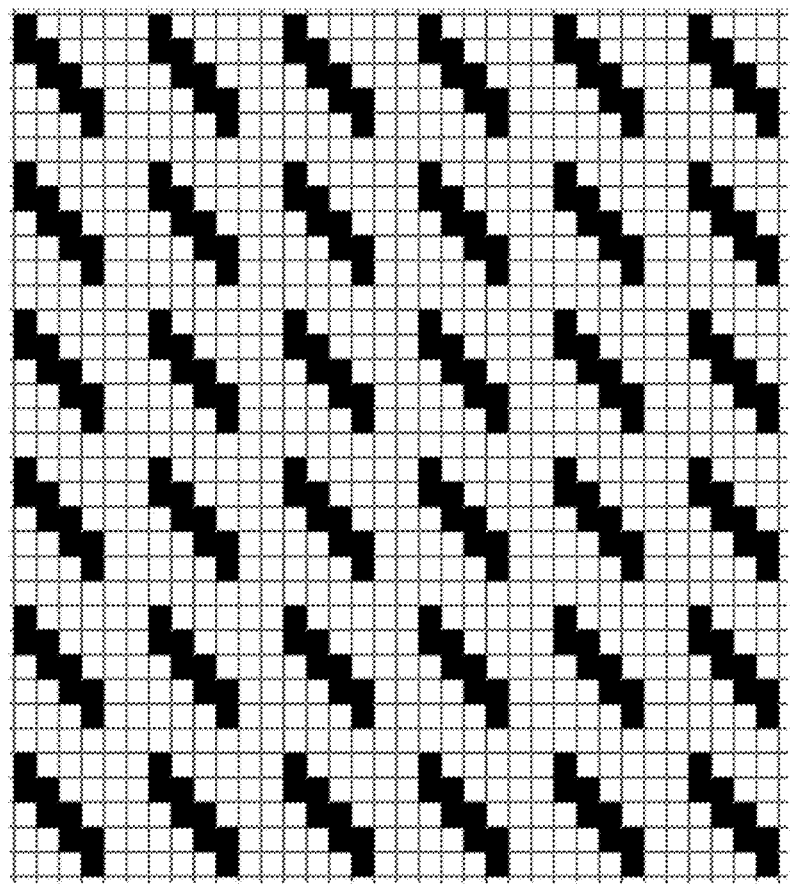
FIG. 9A depicts a bitmap of an exemplary surface screen comprising a dashed line pattern comprising lines of 2-pixel thickness.
Figure 9E:
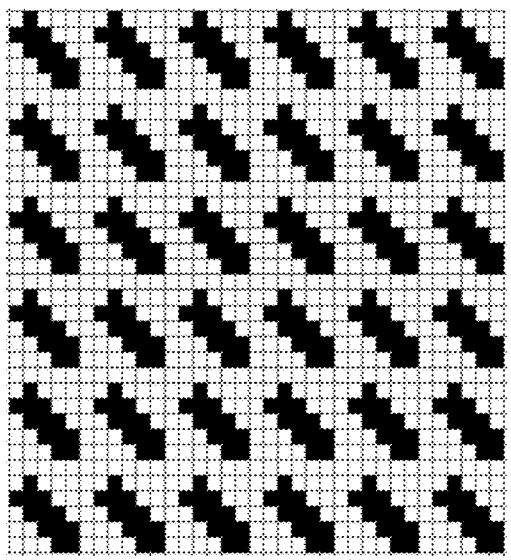
FIG. 9E depicts a 180-degree rotation of the bitmap of FIG. 9B.

As arranged in FIG. 9B, each dash comprises a total of 12 pixels: 4 pixels on the diagonal, 3 pixels wide (e.g. essentially three single-pixel dashes of 4 pixel length, side by side by side). The single-pixel dashes align to form an arrow shape, in which the topmost pixels of the middle single-pixel dash forms the arrow head, and the bottom most pixels of the outward single pixel dashes for a tail. Each of the two side-by-side single-pixel dashes of 4 pixel length have a gap of 2 off pixels between on-pixels in the same line, and an offset of 6 horizontal pixels horizontally (creating a gap of 3 off pixels horizontally between middle portions of the 3-pixel thickness dashes, 4 off pixels at the arrow head, and 5 off pixels at the tail). The dashes align in columns with a single pixel space between columns, and rows with a single pixel space between rows.

The patterns of FIGS. 9A and 9B as depicted exhibit dashed lines at 45-degree angles, but variations at 135-degrees may also be provided. Likewise, although depicted in 2- and 3-pixel variations, it should be understood that multi-pixel line thicknesses greater than 3 pixels may also be used. Furthermore, while all of the multi-pixel varieties as depicted have a single orientation, it should be understood that mixed orientations of 45- and 135-degree angles may be provided.

Figure 9D:
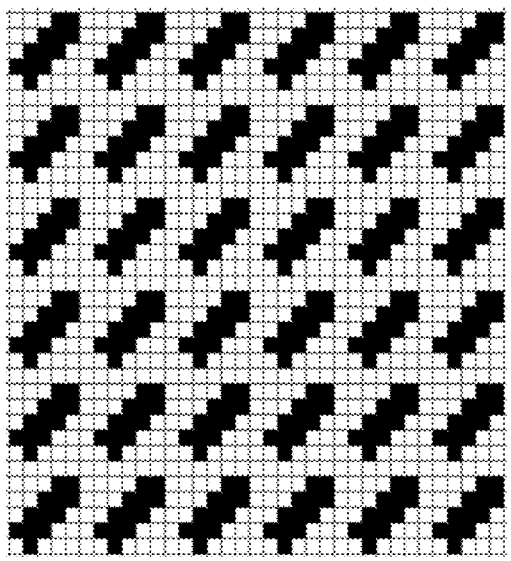
FIG. 9D depicts a mirror image of the bitmap of FIG. 9B inverted across the horizontal axis.
Figure 9C:
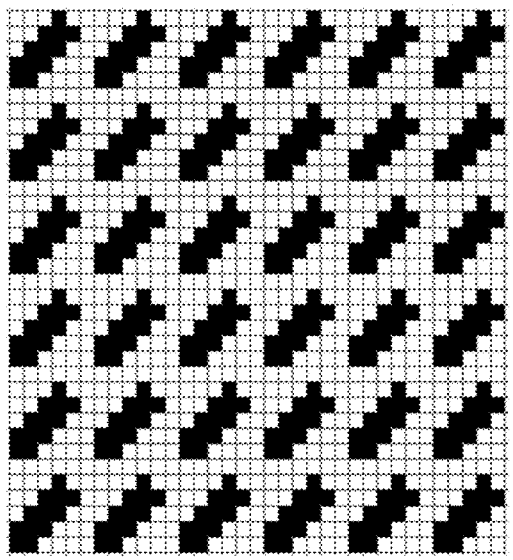
FIG. 9C depicts a mirror image of the bitmap of FIG. 9B inverted across the vertical axis.

Notably, mirror images of FIGS. 9A and 9B inverted over the Y (vertical) axis will result in patterns at 135 degree angles, as illustrated by FIG. 9C, which is the mirror image of the pattern of FIG. 9B. Mirror images inverted over the X (horizontal) axis (or both X and Y axes), may also be provided. For illustration, the mirror image of the pattern of 9B inverted over the X-axis forms the pattern of FIG. 9D in which the arrow formed by the 3-pixel shape is pointing at 45 degrees down (i.e. −45 degrees), and the mirror image of the pattern of 9B inverted over both the X axis and the Y axis (or alternatively characterized as a 180 rotation of the pattern of 9B) forms a pattern in which the arrow formed by the 3-pixel shape is pointing at 135 degrees down (i.e. −135 degrees). Thus, the variations of any single pattern may be referred to as having dashes oriented at 45, 135, −45, or −135 degrees, or combinations thereof. Accordingly, when referring to any specific pattern herein, it should be understood that the equivalent patterns that are mirror images (inverted over either or both axes), rotated (preferably in a multiple of 90-degrees) or that result in dashes oriented at plus or minus 45 or 135 degrees are considered equivalents thereof. Notably, while single-pixel designs are identical with orientations of −45 and 135 degrees (or 45 and −135 degrees), multi-pixel dash designs may have differences in those orientations, and thus combinations of all of 45, 135, −45, and 135 orientations may be provided (e.g. a design comprising alternating columns of each of FIGS. 9B, 9C, 9D, and 9E in sequence).

All of the patterns depicted herein may therefore be described generally as comprising a plurality of dashes, in which each dash or component dash thereof has a same number (M) of two or more adjacent on-pixels in length and a same number (T) of one or more pixels in thickness or width, each dash having an orientation of plus or minus 45 or 135 degrees, or a combination thereof. In embodiments in which same-orientation pixels align to form diagonal lines, those lines may be characterized as comprising dashes of M on-pixels and N off-pixels, with a vertical offset between lines of V pixels. TABLE 1 shows the corresponding values of M, N, and T corresponding to each of the relevant figures:

TABLE 1

| FIG. No. | M | N | T | V |
| --- | --- | --- | --- | --- |
| 1A, 1B | 4 | 2 | 1 | 6 |
| 4A | 4 | 2 | 1 | 6 |
| 4B | 4 | 4 | 1 | 8 |
| 4C | 2 | 2 | 1 | 4 |
| 4D | 3 | 3 | 1 | 6 |
| 9A, 9C, 9D, 9E | 4 | 2 | 2 | 6 |
| 9B | 4 | 2 | 3 | 6 |

All of the patterns depicted herein comprise dashes in which the line segments having the same orientation are orthogonally aligned in identical rows and columns. Even in FIG. 4E, in which same-orientation-dash columns are spaced from one another such that the same orientation dashes do not form aligned diagonal lines, rows and columns having the same orientation are identical, such the dashes align in ordered rows and columns, although columns of different orientation dashes alternate, and rows of same-orientation dashes overlap with one another (i.e. some single-pixel rows contain the top pixels of dashes in one orientation and bottom pixels of dashes in the other orientation).

In some embodiments, patterns with multi-pixel thickness dashes may have orthogonal alignment of the dashes, but each dash may comprises a compilation of component single-pixel dashes wherein at least one of the component single-pixel dashes has more pixels than one or more of the others. For example, the pattern depicted in FIG. 9F differs from that depicted in FIG. 9B by the middle single-pixel-dash component having 5 on-pixels on instead of 4 on-pixels, thus forming a two-sided arrow, rather than the arrow with a distinct head and tail formed in the patterns of FIGS. 9B-9E. It should be further noted that to the extent the designs depicted in FIGS. 9B-9E include tail pixels that are not bordered by other pixels on three sides, such pixels may not form completely or reliably in the plate as they do not form the 2×2 checkerboard that will result in automatic boosting, these designs may effectively form shapes on the plate that would be equivalent to features in which those pixels are not present at all, which may still give acceptable performance.

Figure 9F:
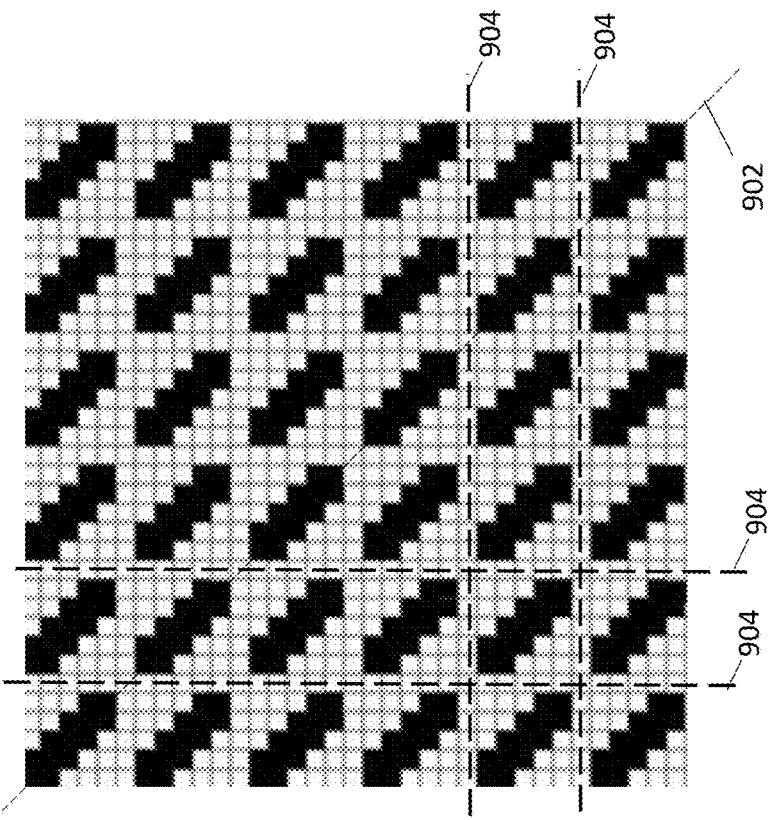
FIG. 9F depicts a bitmap of an exemplary surface screen comprising another 3-pixel dashed line pattern formed of adjacent single-pixel-thick component dashes of having a 4-, 5-, and 4-pixel lengths, respectively.

Finally, another way of viewing the design of FIG. 9F, is that it defines a pattern of 3-pixel diagonal lines parallel to line 902 in which an orthogonal grid of 1-pixel horizontal and vertical strokes 904 spaced 6 pixels apart has been superimposed to turn off any on pixels in the path of those strokes. An advantage of the orthogonal orientation of the strokes in the grid is that the regardless of the rotation or mirror image inversion of the design, the strokes still align orthogonally.

Acceptable patterns are not limited to only orthogonally aligned patterns, however, and it should be understood that variations may be provided in which the position of the line segments vary within a column or row such that the line segments are not orthogonally aligned, or expressed alternatively, the strokes that cut through the diagonal grooves do not form an orthogonal grid.

The patterns as depicted herein may be expressed in many ways, but it should be understood that the underlying principles and nature of the patterns may be broadly applied. To the extent that the dashed lines may be expressed as having an "amplitude" (length of dashes) and a "frequency" (number of dashes per unit length), and the lines have a "spacing," all of which may define a "density" (number of on pixels per unit area), it should be understood that the numerous permutations and combinations of amplitude, frequency, spacing, and density may be applied.

Figure 10:
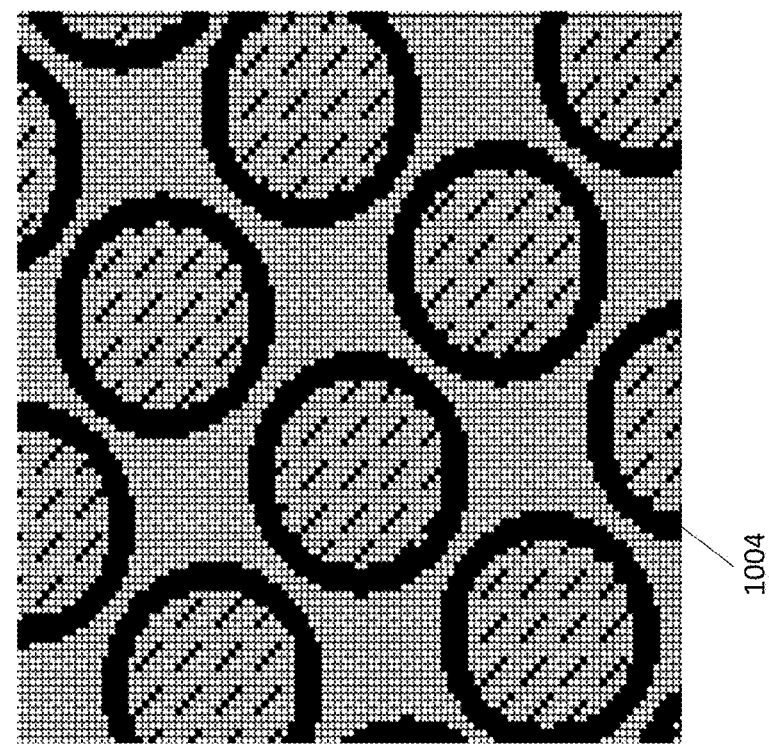
FIG. 10 depicts a bitmap of an exemplary halftone area to which the EXP3 surface pattern has been applied.

Although described primarily herein with respect to the specific utility of applying the surface patterns as disclosed herein to areas of solid rendition, it should be noted that the patterns may also be applied to halftone areas (e.g. areas formed by individual dots or solid or semi-solid areas formed of a plurality of adjacent dots) as well. FIG. 10 depicts a bitmap corresponding to an exemplary halftone area comprising a plurality of halftone dots 1002. In the embodiment depicted, each dot has a protection ring 1004 corresponding to the outline of the dot. When the surface pattern is applied to a halftone dot with such a protection ring, pixels within the ring are left "on" rather than being turned off to match the surface screening pattern. In other embodiments, the surface pattern may be applied without a protection ring. Although the protection rings are depicted with a 4-pixel thickness in FIG. 10, the invention is not limited to use of protection rings of any particular pixel thickness. In fact, in some embodiments, the thickness may vary from dot-to-dot, such as using relatively greater thicknesses for relatively lower screen percentages, and applying a gradient of protection ring thickness that varies inversely with screen percentage. The use of surface screening in halftone dots may be phased in at a certain threshold and used only for screen percentages above that threshold, such as for example, without limitation, at around a 70% screen percentage. Thus, the thickness of the protection ring may vary in such a way that the protection ring has such a relatively greater thickness below a lower threshold (e.g. 70% screen percentage) that it prevents application of the surface pattern at all, and a zero or near-zero thickness above an upper threshold (e.g. 90%) that approaches solid rendition, that the protection ring is not applied at all. The application of surface screens to the surfaces of the halftone dot shapes creates a similar surface roughness, and the benefits thereof for holding ink when printing, as are provided by applying the surface patterns as disclosed herein to solid rendition areas.

The methods and processes as described herein may be implemented on any plate manufacturing system known in the art. Such systems for creating a printing plate comprise at least a computer processor and a digital memory, accessible to the computer processor, that embodies non-transitory machine-readable instructions for performing any of the methods of creating a bitmap as described herein. An imager, controllable by the processor, is configured to apply the bitmap to a mask by forming a pattern of holes in the mask corresponding the bitmap. An exposure unit, optionally controlled by the processor, is configured to expose a photopolymer plate to actinic radiation through the mask. One or more post-exposure units, such as a washing unit, is configured to remove uncured photopolymer from the printing plate. The imager may comprise a laser for forming the holes in the mask, in which case the system is configured to apply a first, relatively greater laser power to features in the bitmap that define a 2×2 checkerboard pattern, and to apply a second, relatively lesser, laser power to features in the bitmap that do not define a 2×2 checkerboard pattern.

As depicted in FIG. 11, an exemplary system 1100 for performing the invention includes processor 1102 with access to computer memory media 1104 containing non-transitory machine-readable instructions stored on the media. The computer memory media may comprise any type of computer memory media known in the art or yet to be widely implemented, including but magnetic, optical, flash memory, and the like, and may include portable media, media co-located with one or more associated processors such as in a desktop or laptop computer or mobile device, and media on a server or otherwise accessible via a network, such as via the Internet, without limitation. The system may also include a display device 1106 configured to present visual information to a human user, and a user interface for receiving input such as instructions from the human user. The user interface may include a visual image rendered on the display device 1106 as part of a graphical user interface (GUI), and any type of user input device 1108 known in the art. Suitable user input devices include, for example, a mouse, trackball or other cursor control and selection device, a keypad for entering alphanumeric instructions, and/or a touchscreen for permitting the user to manipulate the image on the display device. A touchscreen implementation may be configured to permit a user to drawing graphical images or otherwise manipulate the screen using a stylus or finger or multiple fingers, to select radio buttons or items from a menu, such as a dropdown menu, or to select alphanumeric characters on a virtual keyboard. The display/user interface may comprise a mobile device connected to the processor via a wired or wireless network. The processor (which may comprise multiple processors in multiple locations in communication with one another), may reside locally, remotely on a network (including via the Internet), or in part on a mobile device. The invention is not limited to any particular computer system, computer processor, type of display, type of memory or user input device for carrying out the invention.

System 1100 may further be integrated with other components of the workflow for creating a printing plate, including but not limited to imagers 1120, and exposure units 1130. The processor may be part of an integrated system that controls multiple aspects of the platemaking workflow, including exposure units 1130 (which in some embodiments may also receive imagewise information specific to printing or non-printing features on the plate), plate washing (or other plate processing equipment) 1140, and lithographic printing systems 1150 for applying ink to a web of sheet material using printing plates created in accordance with aspects of the invention. Although described herein with respect to an imaged plate using LAM and UV exposure technology, it should be understood that the invention is not limited to any particular method of platemaking, and may include, for example other masking technologies as well as additive manufacturing, without limitation.

Although not limited to use with any specific process conditions, the systems and methods as described herein may be particularly well suited for implementations at relatively high resolution. For example, the specific patterns as described herein may be particularly useful at a resolution of 4000 dpi or greater. In general, the patterns as described herein may work best when certain relationships between absolute pattern structure size and print conditions are optimized (e.g. anilox lines per cm, as described in more detail above). Some of the finer structured patterns (having a relatively lower density—comprising fewer imaged pixels per pattern element) may also be particularly suitable for relatively coarser file resolutions, whereas some of the coarser structured patterns (having a relatively higher density—comprising more imaged pixels per pattern element) may be particularly suitable for relatively finer file resolutions. For example, the pattern depicted in FIG. 4C has been demonstrated to show a favorable increase in solid ink density (SID) at a 2540 DPI file resolution, whereas certain other patterns (e.g. with isolated dots as described in the '141 Publication—not dashes as described herein) performed less favorably. In general, patterns having a density of >1700 dots/cm$^2$ (17 dots per 10×10 pixel), including the pattern shown in FIG. 4C as well as other patterns with isolated dots conforming to the disclosure of the '141 Publication, had more acceptable SID for a 2540 DPI file resolution than patterns comprised of isolated dots having a lower density. In general, patterns that start dot bridging earlier at a low pixel boost appear to outperform those that still have separate dots at high boost when used at relatively finer file resolutions.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A printing plate for printing ink on a substrate, the printing plate having a printing surface for receiving ink, the printing plate comprising:
   a defined area of an image intended to print with ink;
   a surface pattern applied to the defined area, the surface pattern comprising a plurality of rows each having a plurality of diagonally oriented line segments, each line segment corresponding to an ink-carrying relief structure in an area of the plate raised above a floor of the plate, the plurality of diagonally oriented line segments having orientations alternating between a positive angle in one row and a negative angle in an adjacent row, wherein each line segment has a first end aligned with a middle portion of and spaced apart from a first line of a first adjacent row and a second end aligned with a middle portion of and spaced apart from a second line of a second adjacent row.

2. The plate of claim 1, wherein each line segment has an orientation selected from the group consisting of plus or minus 45-degrees and plus or minus 135-degrees with respect to the rows.

3. The plate of claim 1, wherein the first end of each line segment is aligned on center with the first line of the first adjacent row and the second end is aligned on center with the second line of the second adjacent row.

4. The plate of claim 1, wherein each line segment in each row is oriented perpendicular to adjacent line segments in adjacent rows.

5. The plate of claim 1, wherein each of the plurality of line segments have a same number (M) of adjacent touching pixels in total and a same maximum number (T) of one or more adjacent touching pixels in width.

6. The plate of claim 5, wherein M is in the range of 2 to 5 and T=1.

7. The plate of claim 6, wherein each of the plurality of line segments in a same row have a horizontal offset (H) of pixels, wherein H is in a range of 3 to 7.

8. The plate of claim 7, wherein H=M.

9. The plate of claim 8, wherein H=M=3.

10. The plate of claim 1, comprising a first row of first line segments, a second row of second line segments, and a third row of third line segments, the second row disposed adjacent to and between the first row and the third row, the first line segments and the third line segments oriented in a first direction, and the second row of line segments oriented in a second direction different than the first direction, wherein at least some the first line segments are aligned on a same diagonal line with at least some of the third line segments.

11. The plate of claim 1, comprising a first row of first line segments, a second row of second line segments, and a third row of third line segments, the second row disposed adjacent to and between the first row and the third row, the first line segments and the third line segments oriented in a first direction, and the second row of line segments oriented in a second direction different than the first direction, wherein none of the first line segments align on a same diagonal line with any third elevated line segments.

12. The plate of claim 1, wherein surface pattern comprises a pattern selected from the group consisting of the patterns depicted in FIGS. 4A, 4B, 4C, 4D, 4E, and mirror images and rotations thereof.

13. The plate of claim 1, wherein the defined area is a solid rendition area.

14. The plate of claim 1, wherein the defined area is a halftone area.

15. A process for creating a printing plate for printing ink on a substrate, the printing plate having a printing surface for receiving ink, the process comprising:
   a) defining an area of an image intended to print with ink;
   b) applying a surface pattern to the defined area, the surface pattern comprising a plurality of rows each having a plurality of diagonally oriented line segments, each line segment corresponding to an ink-carrying relief structure in a raised area of the plate, the plurality of diagonally oriented line segments having orientations alternating between a positive angle in one row and a negative angle in an adjacent row, wherein each line segment has a first end aligned with a middle portion of and spaced apart from a first line of a first adjacent row and a second end aligned with a middle portion of and spaced apart from a second line of a second adjacent row.

16. The process of claim 12, wherein the printing plate is formed by:
   a) imaging holes in a mask disposed over a curable photopolymer;
   b) exposing the photopolymer to actinic radiation through the holes in the mask, thereby curing portions of the photopolymer receiving the actinic radiation; and
   c) subsequently removing uncured areas of the photopolymer, thereby creating raised areas in the plate having the surface pattern defined by the ink-carrying relief structures corresponding to the line segments.

* * * * *